(12) United States Patent
Cochet et al.

(10) Patent No.: US 11,544,427 B2
(45) Date of Patent: Jan. 3, 2023

(54) METHOD OF SEGMENTATION OF A THREE-DIMENSIONAL IMAGE FOR GENERATING A MODEL OF A MYOCARDIAL WALL FOR THE DETECTION OF AT LEAST ONE SINGULAR ZONE OF ELECTRICAL CIRCULATION

(71) Applicants: UNIVERSITE DE BORDEAUX, Bordeaux (FR); CENTRE HOSPITALIER UNIVERSITAIRE DE BORDEAUX, Talence (FR); FOUNDATION UNIVERSITE BORDEAUX, Bordeaux (FR); INSTITUT NATIONAL DE LA SANTE ET DE LA RECHERCHE MEDICALE, Paris (FR); INSTITUT NATIONAL DE RECHERCHE EN INFORMATIQUE ET EN AUTOMATIQUE, Le Chesnay (FR)

(72) Inventors: Hubert Cochet, Bordeaux (FR); Maxime Sermesant, Mouans Sartoux (FR); Pierre Jais, Saint Médard en Jalles (FR)

(73) Assignees: UNIVERSITE DE BORDEAUX, Bordeaux (FR); CENTRE HOSPITALIER UNIVERSITAIRE DE BORDEAUX, Talence (FR); FOUNDATION UNIVERSITE BORDEAUX, Bordeaux (FR); INSTITUT NATIONAL DE LA SANTE ET DE LA RECHERCHE MEDICALE, Paris (FR); INSTITUT NATIONAL DE RECHERCHE EN INFORMATIQUE ET EN AUTOMATIQUE, Le Chesnay (FR)

( * ) Notice: Subject to any disclaimer, the term of this patent is extended or adjusted under 35 U.S.C. 154(b) by 501 days.

(21) Appl. No.: 16/611,590

(22) PCT Filed: May 11, 2018

(86) PCT No.: PCT/EP2018/062258
§ 371 (c)(1),
(2) Date: Nov. 7, 2019

(87) PCT Pub. No.: WO2018/206796
PCT Pub. Date: Nov. 15, 2018

(65) Prior Publication Data
US 2020/0159973 A1    May 21, 2020

(30) Foreign Application Priority Data

May 10, 2017    (FR) ...................................... 1754107

(51) Int. Cl.
*G06F 30/20*     (2020.01)
*G06T 7/11*      (2017.01)

(52) U.S. Cl.
CPC ................ *G06F 30/20* (2020.01); *G06T 7/11* (2017.01); *G06T 2207/10081* (2013.01); *G06T 2207/30048* (2013.01)

(58) Field of Classification Search
None
See application file for complete search history.

(56) References Cited

U.S. PATENT DOCUMENTS

| 4,344,146 A * | 8/1982 | Davis, Jr. ............. G06V 10/993 |
| | | 901/44 |
| 5,601,084 A | 2/1997 | Sheehan et al. |

(Continued)

FOREIGN PATENT DOCUMENTS

| JP | S64-49540 A | 2/1989 |
| WO | WO 2015/086368 A1 | 6/2015 |

(Continued)

OTHER PUBLICATIONS

International Search Report as issued in International Patent Application No. PCT/EP2018/062258, dated Jun. 28, 2018.

(Continued)

*Primary Examiner* — Jason A Pringle-Parker
(74) *Attorney, Agent, or Firm* — Pillsbury Winthrop Shaw Pittman LLP

(57) ABSTRACT

A method of segmentation of a three-dimensional image for generating a model of a myocardial wall includes recording a three-dimensional image of a wall of the myocardium, the wall delimiting at least one cavity of the heart; segmenting a continuous part of the wall into at least a first volume having a thickness less than a first predefined thickness threshold of between 0 and 5 mm and a second volume of a continuous part of the wall having a thickness greater than the first threshold; generating a model of the wall of the myocardium, where the continuous part of the wall of the myocardium is modelled according to at least two volumes that continue each other.

20 Claims, 4 Drawing Sheets

(56) References Cited

U.S. PATENT DOCUMENTS

| | | |
|---|---|---|
| 9,107,601 B2 | 8/2015 | Schmidt et al. |
| 9,489,474 B2 * | 11/2016 | Hickman ........... G01N 33/5058 |
| 2004/0247165 A1 * | 12/2004 | Nishiura .................. G06T 7/12 |
| | | 382/128 |
| 2007/0049817 A1 * | 3/2007 | Preiss ................. A61B 8/4488 |
| | | 600/407 |
| 2007/0263915 A1 * | 11/2007 | Mashiach ................ G06T 7/11 |
| | | 382/130 |
| 2008/0292169 A1 * | 11/2008 | Wang ..................... G06T 7/174 |
| | | 382/131 |
| 2009/0003680 A1 * | 1/2009 | Lautenschlager .... A61B 6/5217 |
| | | 382/132 |
| 2009/0175515 A1 * | 7/2009 | Schummers .......... G06T 7/0012 |
| | | 382/128 |
| 2009/0190811 A1 * | 7/2009 | Zheng ....................... G06T 7/12 |
| | | 382/128 |
| 2013/0057548 A1 * | 3/2013 | Schreckenberg ....... G06T 17/00 |
| | | 345/420 |
| 2016/0005186 A1 * | 1/2016 | Truong .................. G06V 10/40 |
| | | 382/131 |

FOREIGN PATENT DOCUMENTS

| | | |
|---|---|---|
| WO | WO 2015/165978 A1 | 11/2015 |
| WO | WO 2015/168792 A1 | 11/2015 |

OTHER PUBLICATIONS

Tsai, I.-C., et al., "Left ventricular myocardium segmentatien on arterial phase of multi-detector row computed tomography," Computerized Medial Imaging and Graghics, vol. 36, No. 1, Mar. 2011, XP028340976, pp. 25-37.

Notice of Rejection as issued in Japanese Patent Application No. 2020-512920, dated Feb. 1, 2022.

* cited by examiner

Table of analysis of channels or isthmuses by CT

| Pr N° | Number of channels | Length (mm) | Width (mm) | Area (cm²) | WT(centre of the channel) (mm) | WT(edge of the channel) (mm) | N° of channels parallel to the MA |
|---|---|---|---|---|---|---|---|
| 1 | 4 | 37.8 (24.0-58.4) | 11.9 (10.0-17.5) | 1.93 (1.63-4.43) | 2.4 (2.2-3.4) | 1.9 (1.5-2.3) | 3(75.0%) |
| 2 | 7 | 20.7 (17.6-26.1) | 7.9 (7.3-11.5) | 1.03 (0.88-1.74) | 3.5 (2.3-3.7) | 2.9 (2.1-3.1) | 4(57.1%) |
| 3 | 7 | 38.8 (31.4-62.0) | 14.0 (9.2-32.0) | 1.46 (1.23-12.0) | 2.3 (1.9-3.5) | 1.3 (0.9-1.7) | 4(57.1%) |
| 4 | 3 | 17.7 (9.9-36.8) | 8.6 (7.9-9.0) | 1.59 (0.90-1.92) | 2.1 (1.0-2.5) | 0.8 (0.6-09) | 2(66.7%) |
| 5 | 4 | 15.0 (11.0-21.7) | 5.1 (3.4-9.8) | 0.90 (0.54-1.34) | 2.3 (2.0-2.7) | 1.4 (0.7-1.6) | 4(100.0%) |
| 6 | 7 | 33.2 (30.0-44.9) | 16.5 (10.9-19.9) | 1.75 (1.55-3.58) | 3.0 (2.1-4.6) | 1.3 (0.9-1.7) | 2(28.6%) |
| 7 | 1 | 52.5 (52.5-52.5) | 18.1 (18.2-18.1) | 3.79 (3.79-3.79) | 2.1(2.1-2.1) | 0.7 (0.7-0.7) | 1(100.0%) |
| 8 | 5 | 18.7 (15.6-22.6) | 7.2 (6.4-16.8) | 1.29 (1.11-1.75) | 2.8 (2.3-3.5) | 2.0 (1.9-2.4) | 3(60.0%) |
| 9 | 3 | 36.8 (33.2-41.1) | 7.7 (7.0-44.6) | 1.76 (1.11-2.78) | 1.7 (1.2-2.1) | 0.6 (0.6-0.9) | 2(66.7%) |
| Median | 4 (3-7) | 30.0 (18.5-40.2) | 10.9 (7.2-15.9) | 1.55 (1.05-2.28) | 2.4 (2.1-3.5) | 1.6 (0.9-2.2) | 24/41 (58.5%) |

CT: computer aided tomography   MA: mitral annulus   WT: thickness of the wall

FIG. 5

METHOD OF SEGMENTATION OF A THREE-DIMENSIONAL IMAGE FOR GENERATING A MODEL OF A MYOCARDIAL WALL FOR THE DETECTION OF AT LEAST ONE SINGULAR ZONE OF ELECTRICAL CIRCULATION

CROSS REFERENCE TO RELATED APPLICATIONS

This application is the U.S. National Stage of PCT/EP2018/062258, filed May 11, 2018, which in turn claims priority to French Patent Application No. 1754107 filed May 10, 2017, the entire contents of all applications are incorporated herein by reference in their entireties.

FIELD

The field of the invention relates to image processing and simulation methods for determining particular electrical characteristics of a myocardium model. More specifically, the field of the invention relates to methods of segmentation of a wall of the myocardium in order to isolate and characterise singular electrical phenomena within a modelled myocardium.

PRIOR ART

At present, exploration methods exist making it possible to determine electrical activity on the surface of the myocardium. The study of this electrical activity most generally requires the analysis of maps acquired in an invasive manner, using suitable catheters, localised in 3D. The analysis of the electrical activity inside the myocardium is particularly important for the detection of electrically abnormal zones responsible for potentially lethal arrhythmias. These zones may thereafter be the subject of a targeted treatment.

However, the identification of critical zones responsible for arrhythmias necessitates carrying out long and risky interventions. Furthermore, the definition of targets remains very imperfect, the arrhythmia itself often not being observed. Indeed, it is either impossible to reproduce during the intervention, or too poorly tolerated by the patient to leave the physician time to carry out a mapping with his catheters. The efficiency of these interventions is thus limited and patients frequently present recurrences.

Before these interventions, it is possible to carry out three-dimensional imaging examinations in order to analyse the structure of the muscle. These non-invasive examinations can provide information on the localisation of the scars in question in arrhythmias. On the other hand, no method exists that makes it possible to model the electrical circulation within certain zones of interest, for example zones comprising a scar, in order to identify and to categorise typologies of electrical circuits.

There exists a need to know the possible electrical circuits and their topology in certain zones of interest in order to understand and model electrical propagation in the myocardium.

In total, those skilled in the art have at their disposal invasive methods, for example by means of catheters, and non-invasive methods, for example thanks to imaging, allowing them to localise scars. However, these methods do not make it possible to identify in a reliable manner sites of which the electrical activity is representative of specific singularities.

SUMMARY OF THE INVENTION

The method of the invention makes it possible to resolve the aforesaid problems. Indeed, the method of the invention makes it possible to carry out a segmentation of the wall of the heart in order to generate a model making it possible to isolate or to visualise singular or atypical electrical behaviours within the myocardium.

According to an aspect, the invention relates to a method of segmentation of a thickness of the myocardium derived from a three-dimensional image for the generation of a model of a myocardial wall in order to detect at least one singular electrical circulation, characterised in that it includes:

Recording a three-dimensional image of a wall of the myocardium, said wall delimiting at least one cavity of the heart;

Segmenting a continuous part of the wall into a least one first volume comprising a thickness less than a first predefined threshold, said first threshold being less than a threshold of interest and a second volume of a continuous part of the wall comprising a thickness greater than a first threshold and less than the threshold of interest;

Generating a model of a myocardial wall in which the continuous part of the wall of the myocardium is modelled according to at least two volumes, said wall model making it possible to model at least one electrical gradient between said volumes in order to localise at least one singular zone of electrical circulation.

An advantage is to enable modelling of the wall of the myocardium making it possible to geometrically or electrically detect/identify singular zones. In one case we talk about isthmuses and in the other case singular electrical propagation circuits. An interest of the invention is to identify typologies of singular zones to understand the electrical mechanisms liable to induce effects or not in the propagation of a zone of interest of the myocardium. Another advantage is to make it possible to produce reliable simulators for modelling the electrical activity of the heart.

According to different scenarios, the modelling and more specifically the segmentation of the wall can be carried out according to different embodiments having various advantages: simplicity of the algorithm, finesse of the segmentation by defining a plurality of three-dimensional layers or instead according to whether the segmentation implements an attribution of values of an electrical-physiological parameter or not. According to the desired technical effects, one of the segmentations may be chosen.

According to an embodiment, the method includes a segmentation prior to the first segmentation of at least one region of interest forming a continuous part of the wall of the myocardium and delimited according to a wall thickness criterion, the thickness of the region of interest being less than the maximum thickness threshold.

According to an embodiment, the segmentation of a part of the wall comprises a segmentation of the volumes into at least three types of thicknesses of which a first thickness is less than a first predefined threshold, said first threshold being less than a threshold of interest, a third thickness is greater than a second predefined threshold, said second threshold being less than a threshold of interest, and greater than the first threshold, and a second thickness comprised between the first threshold and the second threshold, the volumes thereby segmented forming three-dimensional layers of different thicknesses.

According to an embodiment, the segmentation of volumes is carried out according to a plurality of thicknesses, a first thickness being less than a first predefined threshold, said first threshold being less than a threshold of interest, a $P^{th}$ thickness comprising:

a thickness greater than a $(P-1)^{th}$ predefined threshold, said $(P-1)^{th}$ threshold being less than a threshold of interest (Si), and a thickness less than a $P^{th}$ predefined threshold, said $P^{th}$ threshold being less than a threshold of interest (Si), the volumes thereby segmented forming three-dimensional layers of different thicknesses.

According to an embodiment, each segmented volume comprises dimensions corresponding to a surface representing the surface of a pixel or a voxel and a thickness corresponding to that of the wall at the considered pixel/voxel, the continuous part of the wall corresponding to a set of at least two pixels/voxels forming a continuous portion of the image, the set of segmented volumes of same thickness each forming a three-dimensional layer.

According to an embodiment, during the segmentation or the generation of the model of a myocardial wall, the method comprises an attribution to each of the segmented volumes of a given value of at least one electrical-physiological parameter.

According to an embodiment, the segmentation of a part of the wall of the myocardium is carried out jointly with an attribution of values of at least one electrical-physiological parameter, the attribution being carried out according to a function associating with each thickness value a value of an electrical-physiological parameter.

According to an embodiment, the attribution of values of at least one electrical-physiological parameter is carried out pixel/voxel by pixel/voxel while considering a continuous part of the wall. In this case, the wall model comprises sets of segmented volumes of same thickness and each being associated with a value of at least one electrophysiological parameter, said sets each forming a three-dimensional layer.

According to an embodiment, at least one electrophysiological parameter is:

a current propagation speed comprised in the range: [0 m/s; 4 m/s] or;

at least one datum characterising the action potential or;

at least one local electrical impedance or electrical resistance of the modelled myocardium wall.

According to an embodiment, a plurality of electrical-physiological parameters may be taken into account. An advantage is to make it possible to electrically model the generated wall with a reliable model and representative of a real operation. A simulation makes it possible to improve the model by comparing the results of a simulation with data extracted from a test on a patient. As an example, the period of a self-sustaining electrical propagation circuit which is modelled and determinable by a simulator may be compared with the period observed on an imaging system representing the electrical activity of the heart.

According to an embodiment, the method comprises a step of simulating the propagation of an electrical current in a generated model of a myocardial wall making it possible to determine the presence of at least one singular electrical propagation circuit, said singular electrical propagation circuit being a self-sustaining periodic circuit or a circuit comprising two loops.

According to an embodiment, the electrical simulation includes a determination of the period of a singular electrical propagation circuit thanks to an imaging system. Advantageously, the imaging system may be coupled to a calculator which makes it possible to analyse the speed of propagation of a signal on a portion forming for example a loop.

According to an embodiment, the determination of the period of a singular electrical propagation circuit includes the detection of a portion of the circuit in which the electrical circulation is slowed down. An advantage is to determine a given portion of a circuit causing a propagation delay. An advantage is thus to make it possible to plan a localised action on a part of a zone identified by the method of the invention.

According to an embodiment, the simulation of the propagation of an electrical current in a generated model of a myocardial wall makes it possible to determine at least one activation of a zone of the myocardium shifted spatially and/or temporally vis-à-vis the start of the activation of the modelled myocardium. An advantage is to study for example, from an imaging system displaying the image of the wall model obtained by the method of the invention, the electrical propagation in the zone of interest. This propagation may be immediately compared with the electrical propagation in a singular zone identified by the method. The analysis of the electrical propagation delay in a singular zone makes it possible to isolate the possible effects of this zone on the general propagation in the wall model. The method of the invention makes it possible to take into consideration the position of the identified singular zone and thus to take into consideration natural spatial and temporal shifts on account of the position of the singular zone. This taking into account makes it possible to isolate the effects of electrical propagation delay resulting uniquely from the geometry of a singular zone.

According to an embodiment, the method comprises a determination of at least one isthmus inducing an electrical gradient between at least two volumes, the geometry of said isthmus being determined by at least one parameter among which:

A given ratio between a thickness of at least two zones adjacent to the isthmus and a thickness of the zone forming said isthmus;

A given width of the zone forming the isthmus characterised by a minimum, average or maximum spacing between two zones adjacent to the zone forming said isthmus;

A given length of the zone forming the isthmus formed by a corridor or peak shape defined by the layout of the adjacent zones;

A given inlet or outlet topology of the isthmus liable to form zones having substantially the shape of a funnel or a portion of funnel;

A local curvature of the isthmus such as the inlet curvature and the outlet curvature of the isthmus.

According to an embodiment, a combination of these characteristics may be taken into account to discriminate singular geometric zones. An advantage is to determine the typologies of singular zones which can be the source of an electrical property inducing for example an arrhythmia. During simulations the annulation of the electrical effects of a given singular zone makes it possible to study the influence of this zone on the propagation of a stimulation.

According to an embodiment, at least one of the parameters characterising the geometry of a zone liable to form an isthmus is compared with a threshold value making it possible to discriminate the category of the shape among the group {isthmus; no isthmus}. An advantage is to automate a method in such a way as next to analyse a set of zones each having been identified as possibly being able to form an isthmus on account of the characteristics that have been compared automatically beforehand.

According to an embodiment, the threshold of interest Si is 5 mm and the maximum threshold is comprised between 6 mm and 12 mm. According to an example in which it is wished to draw closer the zones of interest, the threshold of interest may be reduced to 4 mm. According to certain zones of the myocardium in which a particularity of the wall is known in advance, for example if a scar is known in a zone or if the zone relates to for example a particular spot such as the Apex, then the threshold of interest can take into consideration these data in order to better target the zone to extract.

According to another aspect, the invention relates to a system comprising a memory comprising reference and parameterising data and a calculator for carrying out the steps of the method of the invention.

Notably, the memory can store the images that will be processed, configuration data such as those that make it possible to configure the segmentation and data for attributing values of an electrical-physiological parameter if needs be.

The calculator makes it possible to carry out processing operations aiming to segment the images according to the chosen configuration, to generate the wall model according to the determined embodiment. Moreover, the calculator can implement shape recognition algorithms or algorithms aiming to geometrically or electrically determine singular zones. The calculator can carry out calculations aiming to determine the solutions of an equation aiming to identify singular zones of the model.

According to an embodiment, the system of the invention comprises, moreover, an imaging system for visualising a simulation of an electrical propagation in a generated wall model. The imaging system may for example be configured to identify singular electrical propagation zones. The imaging system may be configured to determine a transit period of the current in a self-sustaining electrical circuit.

According to an embodiment, the system of the invention comprises, moreover, a means for measuring the electrical activity of the heart in order to compare the periodicity of an electrical event with a measured period of a detected singular electrical circuit. Among the means that may be envisaged, surface electrodes may be used. As an example, a belt or jacket of electrodes may be used. According to another example a catheter.

BRIEF DESCRIPTION OF THE FIGURES

Other characteristics and advantages of the invention will become clear on reading the detailed description that follows, with reference to the appended figures, which illustrate:

FIG. 5: the results of the analysis of channels or isthmuses by computer aided tomography on a group of 9 patients.

DESCRIPTION

In the present description, a zone of which the electrical conduction is singular is taken to mean:

a zone in which the electrical conduction is slowed down, that is to say that it is less than a predefined threshold, the predefined threshold being able to be a function of different criteria or;

a zone in which the electrical conduction forms a self-sustaining electrical circuit, or;

a zone in which the electrical conduction forms an electrical circuit comprising at least two connected loops.

More generally, a singular zone is taken to mean:

a zone having either particular electrical propagation characteristics vis-à-vis a larger considered portion or;

a zone having given geometric characteristics characterising the presence of an isthmus. Such a zone is called hereafter "isthmus" when it characterises geometric parameters. The geometric particularities of an isthmus are characteristic of the presence of an electrical gradient which has the consequence of inducing a property of electrical conduction corresponding to an electrically singular zone.

"Arrhythmogenic zone" is taken to mean: a zone in which the electrical circulation is sustained according to a rhythm different from the cardiac sinus rhythm.

In a medical context, a case of cardiac arrhythmia may be caused by an arrhythmogenic zone, such as a scar of the myocardium. The rhythm caused by the arrhythmia is then abnormal and perturbs the cardiac rhythm.

It is specified that it is possible that a cardiac arrhythmia is caused by a reason other than the presence of an arrhythmogenic zone. Conversely, the detection of an arrhythmogenic zone does not automatically signify that it is liable to create a cardiac arrhythmia. Whatever the case, the method of the invention makes it possible to identify the arrhythmogenic zones and their typology in order to categorise the latter and to model electrical propagation in the myocardium.

Recording/Acquisition of the Image

Figure 1:
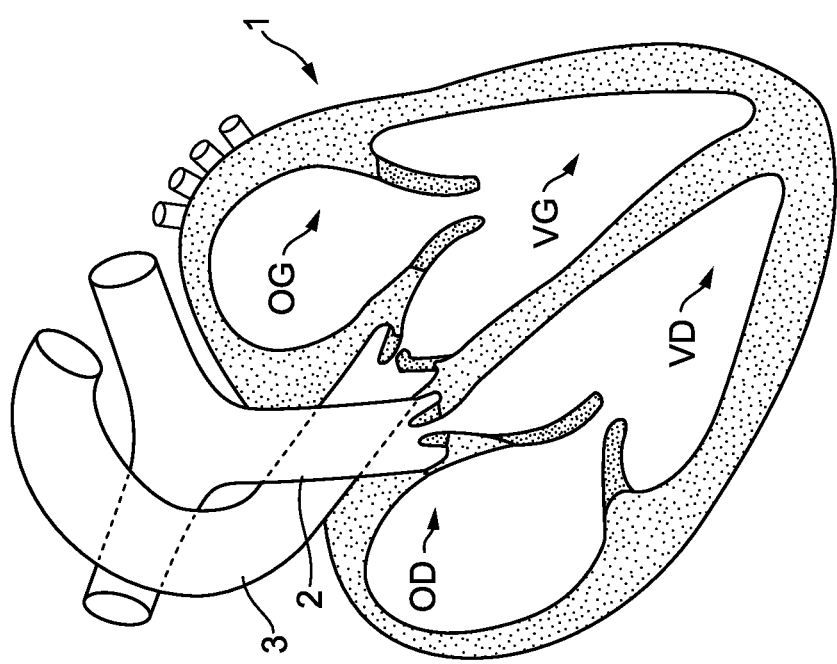
FIG. 1: a view of a heart and regions forming cavities and walls.

FIG. 1 represents a human heart 1. Represented in FIG. 1, within the heart 1, are: a left ventricle, noted VG, a right ventricle, noted VD, a right auricle, noted OD, and a left auricle, noted OG.

In the remainder of the description, "cavity" will designate a circulating blood volume contained in the heart and limited by cardiac walls. 4 cavities exist in the heart: a left ventricle VG, a right ventricle VD, a right auricle OD and a left auricle OG.

The cavities receive a flow of blood which transits between the different arteries, veins and valves 2, 3 connecting certain volumes to each other.

The method of the invention includes a step comprising recording a 3D image of the heart or a region of the heart. The image may be directly acquired from an image acquisition device such as a scanner or an MRI. Alternatively, the image may be obtained by a recording support, the image having already been produced prior to the method of the invention.

The recording step noted ENR in FIG. 4 illustrates this first step of the method. It may be preceded by a step of acquisition of images noted ACQ and represented at the same step as the recording step ENR in FIG. 4. The acquisition step may be carried out by equipment making it possible to produce an image of a heart of a patient or an animal.

Preferentially, the acquired image comprises at least one cavity such as the right ventricle VD or the left ventricle VG or one of the auricles OD, OG as well as the wall surrounding said cavity. This wall includes a muscle called the myocardium, and extends from an internal limit called "endocardium" up to an external limit called "epicardium".

Figure 2:
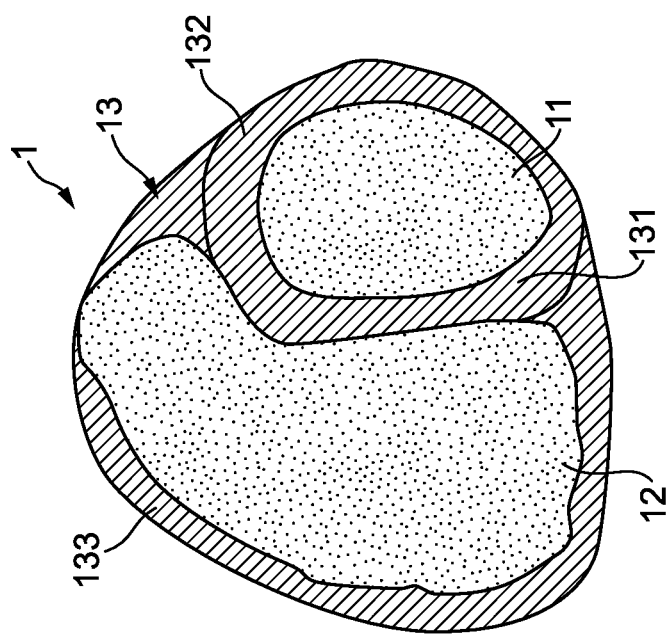
FIG. 2: a section of a three-dimensional image of the heart captured by a scanner with the definition of a valvular plane according to the method of the invention.

FIG. 2 represents a sectional view of a 3D image of FIG. 1 of a heart acquired by means of a scanner. Different zones appear of which:

a zone 12 delimiting the cavity of the right ventricle VD;
a zone 133 delimiting the wall of the right ventricle VD;
a zone 11 delimiting the cavity of the left ventricle VG;
a zone 132 delimiting the wall of the left ventricle VG;
a zone 131 delimiting the wall situated between the two left and right ventricles, called the septum.

The walls 131, 132, 133 are a unique muscular wall noted more generally 13 in the remainder of the description. This wall surrounds the different cavities.

According to an embodiment, the method of the invention includes a recording of a 3D image potentially acquired beforehand, for example by means of a scanner. This acquisition step is noted ACQ in FIG. 4, it is optional.

As an example, it should be noted that the acquisition of the image may involve tomodensitometry, also called "scenography". These techniques are also identified as the CT-scan or the CAT-scan and are based on the measurement of the absorption of X-rays by the tissues of an organ. The digitisation of the images makes it possible to reconstruct the 3D image of the anatomical structures of the observed region.

In the remainder of the description, "image representing a wall of the myocardium" or "wall of the myocardium" are indiscriminately employed by misuse of language in so far as the invention relates to the generation of a model of the myocardium and thus at least an image of the latter to extract therefrom geometric and/or electrical information.

Prior Segmentation: Region of Interest

The generated 3D image includes a volumetric distribution of pixels. A region of interest may then be considered. The method of the invention makes it possible to consider for example the wall 13 of the heart, better known by the name of myocardium. According to an embodiment, a region of interest 21 may then be extracted according to a wall thickness criterion. For example, a region of interest is defined for a thickness of the myocardium less than 5 mm. The definition of a thickness threshold Si of the region of interest 21 makes it possible to extract automatically said region of interest by the processing of the image, this threshold is called "threshold of interest". The threshold of interest Si may be configured according to the considered region of the heart. Thus, at the level of the Apex, the region of interest may have a threshold of interest Si of 4 mm and in another region the threshold of interest Si may be taken equal to 5 mm. In this configuration, the extracted zones of interest are considered independently of each other as a function of their respective thresholds of interest Si.

According to an embodiment, an image processing is implemented to extract at least one region of interest 21 by considering for each point of the myocardium 13 the thickness of the latter and by comparing this thickness with a maximum threshold $S_{max}$. This step is noted SEG_P, it consists in a pre-segmentation of a part of the myocardium in such a way as to carry out the segmentation of the different volumes SEG_1 on the basis of a part uniquely of the myocardium. Alternatively, the segmentation SEG_1 is carried out directly from the recorded image.

According to an embodiment, the maximum threshold $S_{max}$ is configurable according to a weight, age or sex criterion, etc. The maximum threshold $S_{max}$ makes it possible to define a maximum limit of thickness of the myocardium making it possible to define a region of interest to extract in order to segment the thickness of a part of the myocardium. According to an embodiment, the maximum threshold $S_{max}$ can result from an algorithm dependent on a histogram characterising a set of parameters relative to a given context.

Figure 3:
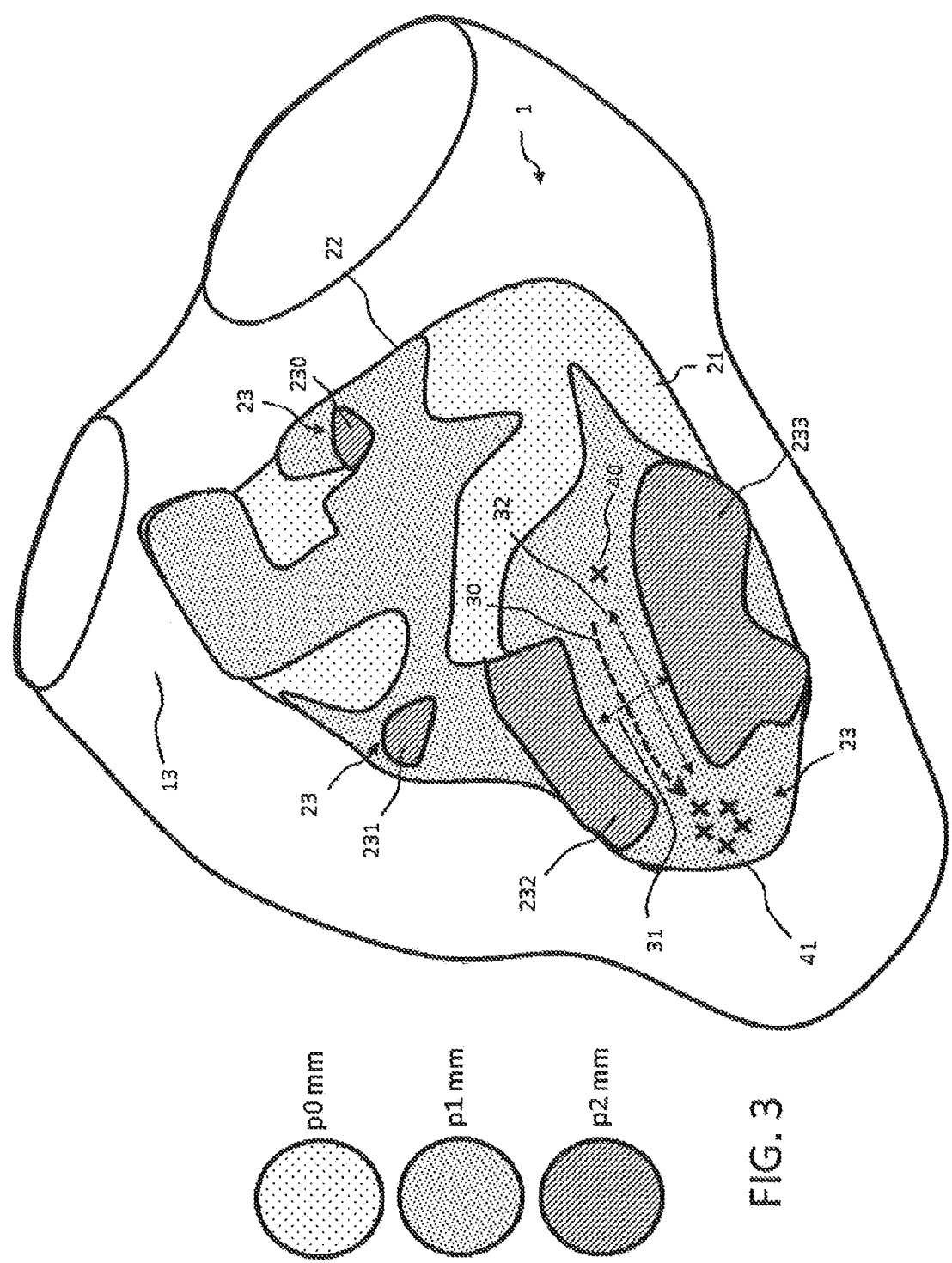
FIG. 3: a representation of a part of a wall of the myocardium defining a zone of interest and segmented volumes.

FIG. 3 represents a model MOD_P generated from the method of the invention. The model MOD_P comprises a three-dimensional image of the myocardium of which the wall has been segmented according to the method of the invention.

According to an embodiment, a part of the three-dimensional image is processed by the method of the invention, it is the region of interest 21. According to an embodiment, the region of interest 21 is defined for a thickness of the myocardium less than 5 mm. This solution makes it possible to consider a single part of the image. An advantage is to reduce the computing time while making it possible to generate a model MOD_P in which geometrical singularities and/or electrical propagation singularities may be identified and localised.

According to another embodiment, a region of interest is defined by all the wall of the myocardium 13. In this case, the segmentation of the method of the invention applies to all the wall of the myocardium. The pre-segmentation SEG_P represented in FIG. 4 is then not carried out. This step is optional.

FIG. 3 represents an image comprising different volumes of the region of interest 21, of which the volumes 22, 230, 231, 232 and 233. More specifically, FIG. 3 represents several volumes 23 noted thereby on account of the fact that they include the same thickness. They are, furthermore, noted 230, 231, 232 and 233 in such a way as to differentiate them, notably for describing the parts adjacent to the isthmus 30. The method of the invention makes it possible to segment these different volumes in order to identify electrical singularities:

either in a geometrical manner by identifying isthmuses such as the isthmus 30 which is comprised between the two portions 232 and 233 of thicknesses less than that of the portion 30;

or in an electrical manner by associating with each segmented volume an electrical-physiological parameter, the volume being able to be defined at the level of a pixel or at the level of a set of pixels in such a way as to carry out an electrical simulation to identify particular electrical behaviours.

Electrical-physiological parameters include notably for the different embodiments of the method of the invention; the amplitude of the transmembrane potential, the electrical conduction speed, the duration of the action potential, a characteristic of the restitution curve.

Segmentation of the Modelled Wall

Figure 4B:
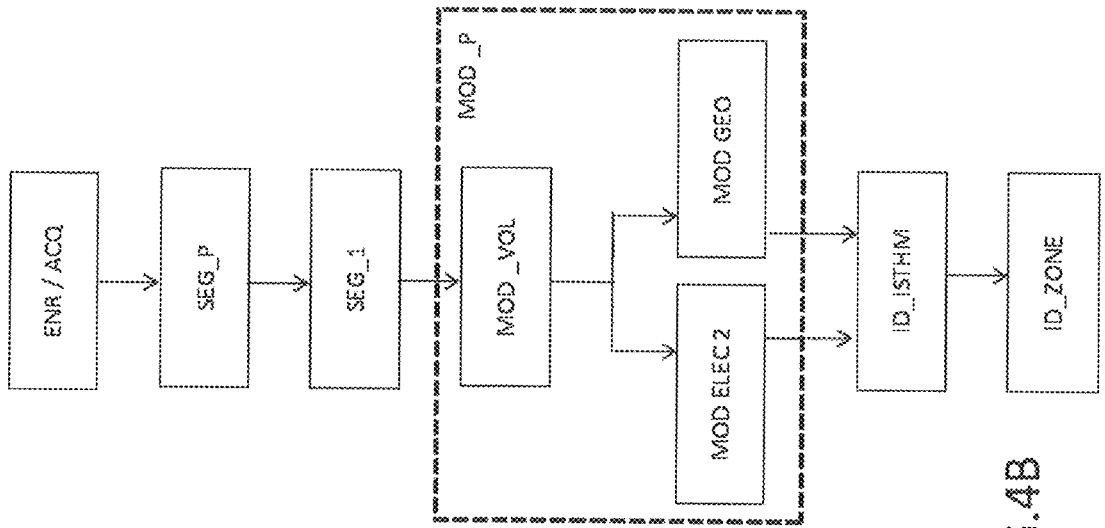
FIG. 4A and FIG. 4B: the main steps of the method of the invention.
Figure 4A:
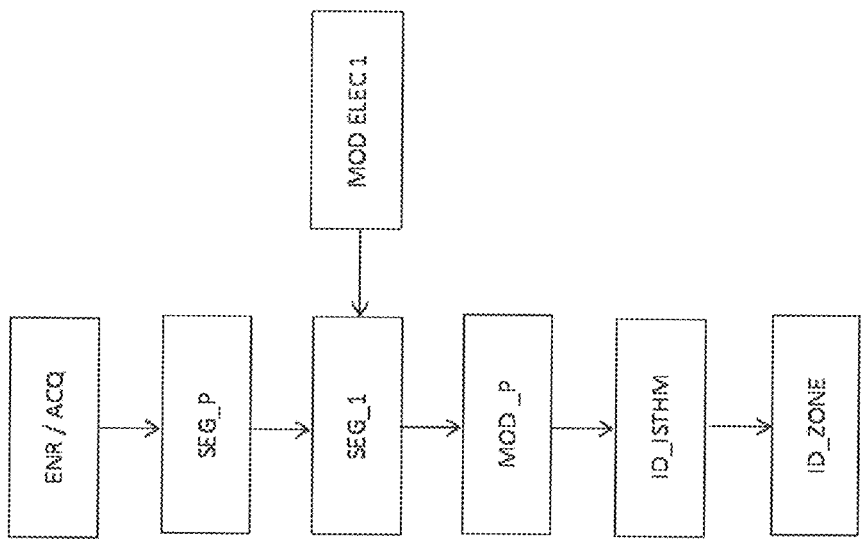

FIG. 4A illustrates a first embodiment of the invention for generating the model MOD_P.

The step of segmentation of the volumes is noted SEG_1 in FIG. 4A.

According to this first embodiment, each point of the wall is considered step by step to associate with it a value of at least one electrical-physiological parameter. This first embodiment thus makes it possible to integrate in the segmentation step an attribution of values of an electrical-physiological parameter to points of the wall, such as pixels or voxels. The segmentation step SEG_1 is then carried out jointly with a step of electrical modelling MOD_ELEC_1 for generating a model MOD_P.

FIG. 4B illustrates a second embodiment of the invention for generating the wall model MOD_P.

According to this second embodiment, the method includes a step of modelling the thicknesses noted MOD_VOL generated from the segmentation operation SEG_1. In this step, each volume is segmented according to a function of the thickness. The segmentation SEG_1 is carried out according to a definition of thickness stages which may be preconfigured. The discretisation of the stages, that is to say their number, may notably be taken into account.

According to an alternative, this second embodiment includes an association/attribution step carried out after the segmentation operation SEG_1, by a modelling noted MOD_ELEC_2 in FIG. 4B for generating a model of the myocardium MOD_P. This electrical modelling is carried out from a modelling of the thicknesses MOD_VOL generated from the segmentation operation SEG_1. When the segmentation operation SEG_1 has terminated, a value of an electrical-physiological parameter is next attributed to each segmented volume. This association may thus be subsequent to the segmentation SEG_1.

According to another alternative, the method includes the definition of a plurality of volumes of different thicknesses segmented at step SEG_1 in order to generate a thickness model MOD_VOL. The model MOD_VOL is next used to geometrically characterise zones of interest of the wall of the myocardium. The step of geometric characterisation of certain zones of the wall 20 or 21 is noted MOD_GEO. This characterisation may next be optionally corroborated with electrical activity models.

According to a first embodiment and with reference to FIG. 4A, the segmentation of all the volumes is carried out according to a thickness criterion at the same time as the attribution of an electrophysiological parameter for each volume. The wall model MOD_P is generated consecutively to this attribution operation.

The attribution between a volume of a given thickness and a given value of an electrical-physiological parameter may be carried out in a discrete manner by blocks of values or may be carried out thanks to a continuous function.

According to a first example, let us consider four volumes of walls V1, V2, V3, V4 segmented by three thresholds comprised between 0 and 5 mm: S1=1 mm; S2=3 mm; S3=4 mm. In this first example, the electrical-physiological parameter is a current propagation speed comprised between 0 and 4 m/s. The propagation speed values are segmented according to ranges of values. A first range G1 is comprised between [0 and 0.5 m/s], a second range G2 is comprised between [0.5 and 1.5 m/s], a third range G3 is comprised between [1.5 and 2.5 m/s], a fourth range G4 is comprised between [2.5 and 4 m/s].

According to this first example, the method of the invention is capable of associating each volume V1, V2, V3, V4 with each of the ranges G1, G2, G3, G4.

According to a second example, the association of the volumes and the values of at least one electrical-physiological parameter is carried out from a continuous function associating the thicknesses with values of at least one electrical-physiological parameter according to a distribution parameter. The distribution parameter makes it possible to adjust the model of the continuous function used.

In this second example, the function may be applied during processing of the image. The segmentation steps are then carried out jointly with the step of attribution of values of the electrical-physiological parameter. According to an embodiment, an association algorithm for the image processing carries out the operations step by step. A first point of the wall is considered, a calculation of the thickness of the wall at this point is carried out, an attribution of a value of an electrical-physiological parameter is associated with this thickness value at this point. A model is then produced thanks to the association algorithm.

According to a first alternative embodiment, a considered electrophysiological parameter is the current propagation speed in the wall of the myocardium. A current propagation model is considered which depends on the thickness of the myocardium which may then be integrated during the operation of segmentation of the wall. According to a first example, the model may be a discrete model in which current speeds are associated with a thickness. According to another example, the second model may be a continuous model. In this latter case, the integration of this model is carried out from a continuous distribution function.

According to a second alternative embodiment, a considered electrophysiological parameter is a datum characterising an action potential of a part of the myocardium. The action potential may be characterised notably by an amplitude and/or duration of the action potential.

According to another alternative embodiment, a considered electro-physiologic parameter is a local impedance or a resistance of the tissue forming the wall of the myocardium.

Second Embodiment

According to a second embodiment and with reference to FIG. 4B, the segmentation of the wall 20 or 21 into a plurality of volumes 22, 23 is carried out without a particular attribution to a electrophysiological parameter being carried out. The volumes 22, 23 are next characterised geometrically in order to determine zones of interest liable to conduct a current in the wall of the myocardium according to a propagation speed which is different, for example greater, than the propagation speed of the current circulating in a zone of the not very conductive wall of the myocardium. A not very conductive zone is characteristic of a necrotic zone or of a zone in which the muscle is no longer electrically conductive enough.

The geometric characterisation of zones of interest is obtained by a step of determining a certain number of geometric characteristics of at least one isthmus, such as the isthmus 30, formed in the wall of the myocardium 20. An isthmus 30 is defined by:
  its thickness with regard to the thicknesses of adjacent zones 232, 233. It thus involves retaining a thickness difference to evaluate the relative "height" of the isthmus.
  its width 31 formed by the spacing of said adjacent zones 232, 233. A median, average, minimum or maximum width may be considered according to different exemplary embodiments. According to other exemplary embodiments, different measurements may be carried out to take into account a particular topology of the evolution of the width of an isthmus.
  its length 32 formed by the corridor or the peak defined by the arrangement of the adjacent zones 232, 233.
  the inlet and outlet topology of an isthmus 30 may be taken into account, such as the funnel formed by the two adjacent zones 232 and 233 which make it possible to evaluate the behaviour of a concentration of electrical charges and thus a flow of current and thus an electrical propagation speed at the inlet or at the outlet of an isthmus.

As regards the inlet and outlet topologies of the isthmus which are liable to form concentration zones or emerging zones modifying the propagation speeds of the current circulating on the surface of the myocardium, different detection techniques may be used. These zones may be characterised, for example, by the convergence or the divergence of the two zones adjacent to one or the other of the ends of the isthmus. The convergence or the divergence of adjacent zones may be, for example, obtained by a measurement of tangents or a measurement aiming to characterise the shape of the funnel defined by the two adjacent zones.

According to an embodiment, the inlet and/or outlet curvatures of an isthmus may be calculated to discriminate the relevance of the singularity of an isthmus.

The singularity of an isthmus makes it possible to characterise a zone of the model of the myocardium notably as regards the propagation of the electrical conduction assumed to take place in this zone on account of the presence of the isthmus and its typology. The isthmus may in a first approximation be characterised by a local electrical gradient which is generated between two segmented volumes.

According to an embodiment, several geometric criteria are taken together and combined so as to optimise the discrimination of a singular isthmus.

According to an embodiment, reference values defining thresholds for comparisons of the geometric parameters above make it possible to discriminate an isthmus or to categorise a type of isthmus. According to an embodiment, these values make it possible to evaluate an electrical parameter associated with the isthmus such as the speed of electrical propagation in the isthmus or the flow of current transiting therein.

These evaluated parameters make it possible to discriminate, or even to categorise and evaluate, a type of isthmus. The reference values may be weighted or adapted according to parameters such as the volume of the heart, the age of a cell or patient, the level of fat present in the myocardium or instead past medical history data of a patient.

According to an embodiment, the values of these parameters may be automatically calculated from a shape recognition algorithm or a morphological algorithm or a particular function making it possible to identify singularities defining the presence of an isthmus.

The step of identification of an isthmus responding to certain predefined criteria is noted ID_ISTHMI.

Optionally, the method of the invention includes according to an embodiment of the invention a step noted ID_ZONE liable to form a zone of concentration of charges at the outlet or at the inlet of an isthmus.

An interest of the invention is thus to take into account notably the thickness, the width and the length of zones forming isthmuses in order to model zones liable to conduct current at propagation speeds greater than those in which current propagates at a slowed down speed on account of a particularity of the myocardium.

Geometric Modelling by Generation of a Function with 2 Variables for Modelling the Wall According to an embodiment, the model of the wall MOD_P of the myocardium comprises the generation of a model of the thickness of the wall modelled by a function with two variables and the determination of maximums forming continuous lines.

According to an embodiment, the maximums are determined from the determination of the zeros of the derivative function and the analysis of the value of the determinant of the Hessian function for the determined zeros.

According to an embodiment, the model of the wall MOD_P of the myocardium comprises the discrimination of determined lines of which the corresponding wall thickness is greater than a predefined threshold.

According to an embodiment, the method of the invention comprises a calculation of the derivatives and Hessian functions directly in the three-dimensional model in order to determine eigenvectors that will make it possible to discriminate the presence or not of isthmus(es).

According to an embodiment, the method comprises:
an identification of at least one emerging zone of an isthmus;
an ablation of said emerging zone.

According to an embodiment, the method comprises a simulation of the propagation of an electrical current in the generated wall model. The electrical simulation comprises the injection of a current into the model of the wall MOD_P with an electrical modelling of the wall. The injection of a current may for example model the electrical activation of the myocardium. The injected current may be for example of sinusoidal type. Different scenarios for generating an electrical current making it possible to induce a given simulation may be configured.

The simulation of the wall model includes the definition of a virtual stimulation which, in silico, could make it possible to electrically model single electrical conduction zones in the wall and could thus make it possible to detect zones having particular electrical conduction characteristics. Moreover, these zones may be optionally associated with a criticality factor for example representative of a probability of occurrence of an arrhythmia circuit. Indeed, this virtual stimulation could trigger a virtual ventricular tachycardia and the intra-scar path of the circuit could be used to define the targets to treat during an ablation intervention by catheter. This strategy could be particularly relevant in patients for whom the arrhythmia is not inducible clinically or too poorly tolerated to be mapped.

According to an exemplary embodiment, when the stimulation in silico triggers a virtual ventricular arrhythmia, a virtual ablation of the intra-scar part of the circuit could be carried out to confirm that the arrhythmia is no longer inducible. This process could be repeated virtually as long as there is an inducible tachycardia.

Thus, the method of the invention could favour the caring practice of virtual surgical operations with a view to preparing a real operation.

Stimulations of an important number of sites in and around a zone of interest, such as a scar, of a wall model could be used for the prediction of the risk of ventricular arrhythmias. One of the limits of clinical stimulation, in a patient, is the fact that only 2 to 3 sites can be stimulated. A model in silico has virtually no limit with regard to the number of sites to which a programmed stimulation protocol may be applied. The test would be considered as positive if a ventricular arrhythmia is actually virtually inducible.

Thus, the production of a wall model makes it possible to carry out numerous tests in order to characterise the singular electrical propagation circuits detected thanks to the method of the invention.

According to an embodiment of the invention, the behaviour of the singular electrical signals in a zone of interest may also be studied. A singularity index may be defined as a function of the coupling or not, or instead a degree of coupling between the singular electrical signals detected with the remainder of the myocardium. The decoupling may for example result from an electrical activation of singular electrical zones with increasing delays during the stimulation.

According to an embodiment, a virtual mapping may be brought together on a same model cumulating the maps of singular electrical signals obtained for all the virtual simulation sites. It is known in fact that the stimulation site is important and makes it possible to reveal singular electrical signals otherwise masked.

This type of virtual stimulation could thereby improve detection of patients at risk and become a significant aid in the decision to implant a defibrillator.

The simulation then makes it possible to localise the presence of a singular electrical propagation circuit. According to a first example, a singular electrical circuit forms a loop through which passes a current according to a period T. According to another example, a singular electric circuit forms a "8", that is to say two loops through which passes a current according to another period T. Other singularities may be identified comprising for example a circuit having an electrical discontinuity.

The method of the invention makes it possible to discriminate a singular electrical propagation circuit among a plurality of identified circuits by comparing the periods of each of them with a given period that is searched for. Indeed, by bringing together the arrhythmias or particular events in a given electrocardiogram, it is possible to determine the circuit causing an arrhythmia or a particular electrical event. The electrocardiogram may be obtained from surface electrodes or a catheter or any other equipment making it possible to measure electrical activity of the heart.

Electrocardiographic or physiological or cartographic recordings of surfaces may be used to define a reference period. The reference period is then automatically compared with measured periods of singular electrical propagation circuits of the wall model.

According to another usage, the recordings may be used to configure or to correct a configuration of the wall model. For example, when an electrical event is identified on a recording and when a detected singular electrical propagation circuit is associated with this event, then the model may be corrected, such as for example the values of attribution of current speed. The model may thus be refined thanks to the taking into account of compensation parameters in the configuration of the wall model.

Thus, the method, when it is associated with a reference ECG comprising a determinable electrical event, may serve:
either to improve the quality of the model of the wall,
or to identify a particular singular circuit among a plurality of candidate circuits in order to be brought closer to a particular electrical event of the reference ECG and identified by a device for measuring the electrical activity of the heart.

According to an exemplary embodiment, the method of the invention makes it possible to detect at least one electrical propagation circuit in at least one region of the myocardium when the latter is shifted temporally and/or spatially compared to the start of the electrical activation of the myocardium modelled by the method of the invention, that is to say at the start of the wave QRS. According to an exemplary embodiment, the measured shift takes into account the distance between the zone of the start of activation of the myocardium and the zone in which the singular electrical propagation circuit is measured. Indeed, the propagation time of the electrical wave may be taken into account in the determination of the temporal and/or spatial shift.

FIG. 3 represents electrical charges 40, 41 transiting in the isthmus 30. The incoming charges are noted 40 and the outgoing charges are noted 41. The detection ID_ISTHM of the isthmuses 30 makes it possible to model the electrical behaviour of the myocardium. The simulation of electrical cardiac activity makes it possible to detect electrical singularities on the surface of the myocardium. A dynamic model of the myocardium may be used in order to better understand the electrical behaviour of the heart, for pedagogic purposes or instead to monitor the evolution of a situation over time.

When the isthmus 30 is liable to cause an arrhythmia, it is then possible to use the method of the invention to determine a place ID_ZONE in which it is desirable to carry out an ablation of cells in order that electrical current no longer circulates. This operation makes it possible for example to avoid the formation of a self-sustaining electrical propagation circuit liable to trigger an arrhythmia.

A comparative study has been carried out to evaluate the efficiency of the method for identifying isthmuses according to the present invention from geometric considerations. To do so, mappings of activation of ventricular tachycardia (TV) were carried out on 9 patients suffering from ventricular tachycardias (TV) presenting recurrences before the ablation step. These mappings make it possible to localise the isthmuses or channels which are the target of ablation, the aim of which is to abolish conduction through these isthmuses between scars by electrophysiological characteristics. The electrophysiological isthmuses are next compared with the morphological isthmuses identified by the method of the present invention based on geometric characteristics. The results of the study are resumed by means of the table of FIG. 5.

Characteristics of the Patients 9 patients of which the average age at the moment of the ablation is 57±15 years. The average ejection fraction of the left ventricle at the moment of ablation is 34%±7%. The infarcts are identified on the lower wall of the myocardium in 4 patients, on the rear wall in 4 patients and the lateral wall in 2 patients.

Method for Identifying Isthmuses According to the Second Embodiment of the Invention CT-Scan scanner images were carried out on these same patients 1 day or 3 days before the ablation procedure. These images were next processed according to the method of the present invention according to the following steps:
Segmenting the acquired images and in particular a region of interest of the wall of the heart defined for a thickness less than 5 mm in a plurality of volumes,
Constructing a mapping with iso-surfaces of thicknesses respectively less than 1 mm, 2 mm, 3 mm, 4 mm and 5 mm.
Identifying morphological isthmuses according to the following geometric characteristics; this characterisation step corresponding to the step ID_ISTHM of FIG. 4B:
Zone of interest of which the wall has a thickness less than 5 mm;
The morphological isthmuses (or channels) have a thickness less than the thickness of the adjacent zones, situated on either side of the isthmuses;
The isthmuses are longer than wide;
Method for Identifying Electrophysiological Isthmuses Via TV Mapping Using the Rhythmia® (Boston Scientific, Marlborough, Mass., United States) mapping system, a three-dimensional mapping of anatomical electrical activity of the cardiac cavities of the left ventricle is acquired in sinus rhythm and by stimulated TV to localise target ablation zones, namely zones of scarred tissue substrate of the arrhythmia. The mapping thus makes it possible to localise the isthmuses (channels) between scars responsible for conductions from electrophysiological characteristics.

Comparative Study the TV mapping and the CT-Scan mapping are merged together, this merging was carried out by projecting the points of the mappings obtained in sinus rhythm and by TV onto the corresponding points of the mapping obtained by CT-Scan using a nearest neighbour method, Results and Discussion 41 morphological isthmuses are identified according to the method of the present invention. The median length, the width and the area of the isthmuses CT are respectively 30.0 (18.5-40.2) mm, 10.9 (7.3-16.0) mm, and 1.55 (1.05-2.28) $cm^2$, the median thickness is 2.4 (2.1-3.5) mm at the level of the isthmuses, and 1.6 (0.9-2.2) mm at the level of the borders (P<0.0001). No isthmus was identified in regions having a thickness less than 1 mm and no border region was identified in a region having a thickness greater than 4 mm.

The comparative study between the morphological isthmuses and the electrophysiological isthmuses made it possible to demonstrate in a quantitative manner that all the electrophysiological isthmuses have been associated with the critical isthmus of a mapped VT.

Furthermore, among the 41 morphological isthmuses identified, 21 (51.2%) could correspond to critical electrophysiological isthmuses corresponding to diastolic potentials, and 13 (37.7%) to electrophysiological isthmuses corresponding to average diastolic potentials.

This study shows that the method of the present invention may be used as a reliable tool for identifying isthmuses with high sensitivity. The morphological information of the isthmuses may be used as a complement to electrophysiological isthmuses for better targeting critical zones for ablation.

The invention claimed is:

1. A method of segmentation of a thickness of the myocardium derived from a three-dimensional image for generating a model of a myocardial wall in order to detect at least one singular electrical circulation, the method comprising:
   recording a three-dimensional image of a wall of the myocardium, said wall delimiting at least one cavity of the heart;
   segmenting a continuous part of the wall into at least one first volume comprising a thickness less than a first predefined threshold, said first threshold being less than a threshold of interest and a second volume of a continuous part of the wall comprising a thickness greater than the first threshold and less than the threshold of interest, and
   generating a model of the wall of the myocardium in which the continuous part of the wall of the myocardium is modelled according to at least two volumes, said wall model modelling at least one electrical gradient between said at least two volumes in order to localise at least one singular zone of electrical circulation.

2. The method according to claim 1, further comprising:
   a segmentation prior to the segmenting of a continuous part of the wall of at least one region of interest forming a continuous part of the wall of the myocardium and delimited according to a wall thickness criterion, the thickness of the region of interest being less than a maximum thickness threshold.

3. The method according to claim 1, wherein each segmented volume comprises dimensions corresponding to a surface representing the surface of a pixel or a voxel and a thickness corresponding to that of the wall at the considered pixel/voxel, the continuous part of the wall corresponding to a set of at least two pixels/voxels forming a continuous portion of the image, the set of segmented volumes of same thickness each forming a three-dimensional layer.

4. The method according to claim 1, wherein during the segmenting or the generating of the model of the wall of the myocardium, the method implements an attribution to each of the segmented volumes of a value of at least one electrical-physiological parameter.

5. The method according to claim 4, wherein the segmenting of a continuous part of the wall of the myocardium is carried out jointly with an attribution of values of at least one electrical-physiological parameter, the attribution being carried out according to a function associating with each thickness value a value of an electrical-physiological parameter.

6. The method according to claim 4, wherein the attribution of values of at least one electrical-physiological parameter is carried out pixel/voxel by pixel/voxel by considering a continuous part of the wall , the wall model comprising sets of segmented volumes of same thickness and each being associated with a value of at least one electrophysiological parameter, said sets each forming a three-dimensional layer.

7. The method according to claim 4, wherein at least one electrical-physiological parameter is:
   a current propagation speed comprised in the range: [0 m/s; 4 m/s] or;
   at least one datum characterising the action potential or;
   at least one local electrical impedance or electrical resistance of the modelled wall of the myocardium.

8. The method according to claim 4, further comprising simulating the propagation of an electrical current in a generated model of a myocardial wall making it possible to determine the presence of at least one singular electrical propagation circuit, said singular electrical propagation circuit being a self-sustaining periodic circuit or a circuit comprising two loops.

9. The method according to claim 8, wherein the electrical simulation includes a determination of the period of a singular electrical propagation circuit thanks to an imaging system.

10. The method according to claim 9, wherein the determination of the period of a singular electrical propagation circuit includes the detection of a portion of the circuit in which the electrical circulation is slowed down.

11. The method according to claim 8, wherein the simulation of the propagation of an electrical current in a generated model of a myocardial wall makes it possible to determine at least one activation of a zone of the myocardium shifted spatially and/or temporally vis-à-vis the start of the activation of the modelled myocardium.

12. The method according to claim 1, further comprising determining at least one isthmus inducing an electrical gradient between at least two volumes, the geometry of said isthmus being determined by at least one parameter among which:
   a given ratio between a thickness of at least two zones adjacent to the isthmus and a thickness of the zone forming said isthmus;
   a given width of the zone forming the isthmus characterised by a minimum, average or maximum spacing between two zones adjacent to the zone forming said isthmus;
   a given length of the zone forming the isthmus formed by a corridor or peak shape defined by the layout of adjacent zones;
   a given inlet or outlet topology of the isthmus liable to form zones having substantially the shape of a funnel or a funnel portion;

a local curvature of the isthmus such as the inlet curvature and the outlet curvature of the isthmus.

13. The method according to claim 12, wherein at least one of the parameters characterising the geometry of a zone liable to form an isthmus is compared to a threshold value making it possible to discriminate the category of the shape among the group {isthmus; no isthmus}.

14. The method according to claim 1, characterised in that the threshold of interest is 5 mm and that the maximum threshold is comprised between 6 mm and 12 mm.

15. A system comprising a memory comprising reference and parameterisation data and a calculator to carry out the steps of the method according to claim 1.

16. The system according to claim 15, further comprising an imaging system for visualising a simulation of an electrical propagation in a generated wall model.

17. A system comprising a memory comprising reference and parameterisation data and a calculator to carry out the steps of the method according to claim 1, the system further comprising a means for measuring the electrical activity of the heart in order to compare the periodicity of an electrical event with a measured period of a detected singular electrical circuit.

18. The system according to claim 17, wherein the means comprises electrodes or a catheter.

19. A method of segmentation of a thickness of the myocardium derived from a three-dimensional image for generating a model of a myocardial wall in order to detect at least one singular electrical circulation, the method comprising:
recording a three-dimensional image of a wall of the myocardium, said wall delimiting at least one cavity of the heart;
segmenting a continuous part of the wall into at least one first volume comprising a thickness less than a first predefined threshold, said first threshold being less than a threshold of interest and a second volume of a continuous part of the wall comprising a thickness greater than the first threshold and less than the threshold of interest, and generating a model of the wall of the myocardium in which the continuous part of the wall of the myocardium is modelled according to at least two volumes, said wall model modelling at least one electrical gradient between said at least two volumes in order to localise at least one singular zone of electrical circulation,
wherein the segmenting of a continuous part of the wall comprises a segmentation of the at least one first and second volumes into at least three types of thicknesses of which a first thickness is less than a first predefined threshold, said first threshold being less than a threshold of interest, a third thickness is greater than a second predefined threshold, said second threshold being less than a threshold of interest, and greater than the first threshold, and a second thickness comprised between the first threshold and the second threshold, the volumes thereby segmented forming three-dimensional layers of different thicknesses.

20. The method according to claim 19, wherein the segmenting of the at least one first and second volumes is carried out according to a plurality of thicknesses, a first thickness being less than a first predefined threshold, said first threshold being less than a threshold of interest, a $P^{th}$ thickness comprising:
a thickness greater than a predefined threshold, said threshold being less than a threshold of interest, and
a thickness less than a $P^{th}$ predefined threshold, said $P^{th}$ threshold being less than a threshold of interest,
the volumes thereby segmented forming three-dimensional layers of different thicknesses.

* * * * *